(12) United States Patent
Cosgrave et al.

(10) Patent No.: US 11,493,362 B2
(45) Date of Patent: Nov. 8, 2022

(54) SYSTEMS AND METHODS FOR DETECTING MAGNETIC TURN COUNTER ERRORS

(71) Applicant: Analog Devices International Unlimited Company, County Limerick (IE)

(72) Inventors: Gavin Patrick Cosgrave, Enniscorthy (IE); Jeremy Richard Gorbold, Newbury (GB)

(73) Assignee: Analog Devices International Unlimited Company, Limerick (IE)

( * ) Notice: Subject to any disclaimer, the term of this patent is extended or adjusted under 35 U.S.C. 154(b) by 28 days.

(21) Appl. No.: 16/991,731

(22) Filed: Aug. 12, 2020

(65) Prior Publication Data

US 2022/0049976 A1 Feb. 17, 2022

(51) Int. Cl.
*G01D 5/14* (2006.01)
*G01R 33/09* (2006.01)
*G01D 5/244* (2006.01)

(52) U.S. Cl.
CPC .............. *G01D 5/145* (2013.01); *G01R 33/09* (2013.01); *G01D 5/2448* (2013.01)

(58) Field of Classification Search
CPC ....... G01D 5/145; G01D 5/2448; G01R 33/09
See application file for complete search history.

(56) References Cited

U.S. PATENT DOCUMENTS

| 6,870,470 B2 | 3/2005 | Nomura et al. |
| 8,115,479 B2 | 2/2012 | Aimuta et al. |
| 8,471,552 B2 | 6/2013 | Suzuki |
| 8,884,610 B2 | 11/2014 | Van Veldhoven et al. |
| 9,310,448 B2 | 4/2016 | Kuwano |

(Continued)

FOREIGN PATENT DOCUMENTS

| DE | 102010064201 A1 | 6/2012 |
| EP | 0 381 963 | 8/1990 |

(Continued)

OTHER PUBLICATIONS

International Search Report and Written Opinion dated Oct. 7, 2021 in application No. PCT/EP2021/070799.

*Primary Examiner* — Noam Reisner
(74) *Attorney, Agent, or Firm* — Knobbe, Martens, Olson & Bear, LLP (57) ABSTRACT

Systems and methods for detecting magnetic turn counter errors are provided herein. In one aspect, there is provided a magnetic field turn sensor system including: a magnetic field angle sensor, a signal processing path configured to receive an output from the magnetic field angle sensor and generate an angle measurement based on the output, a turn count path configured to process the output from the magnetic field angle sensor and output a quadrant measurement based on the output and a processor. The processor is configured to: receive the angle measurement from the signal processing path and the quadrant measurement from the turn count path, determine that the angle measurement deviates from the expected transition angle by more than a threshold value, and indicate a fault in response to determining that the angle measurement deviates from the expected transition angle by more than the threshold value.

17 Claims, 8 Drawing Sheets

(56) References Cited

U.S. PATENT DOCUMENTS

| | | |
|---|---|---|
| 9,475,520 B2 | 10/2016 | Yanai et al. |
| 9,506,996 B2 | 11/2016 | Granig |
| 9,663,140 B2 | 5/2017 | Sone |
| 9,664,752 B2 | 5/2017 | Monreal et al. |
| 10,073,136 B2 | 9/2018 | Milano et al. |
| 10,156,461 B2 | 12/2018 | Snyder et al. |
| 10,267,870 B2 | 4/2019 | Cosgrave et al. |
| 10,309,803 B2 | 6/2019 | Cosgrave et al. |
| 2011/0246133 A1 | 10/2011 | Harada et al. |
| 2012/0116717 A1 | 5/2012 | Satou et al. |
| 2016/0167701 A1* | 6/2016 | Sone .......................... G01L 3/12 701/43 |
| 2016/0245677 A1 | 8/2016 | Cosgrave et al. |
| 2016/0288823 A1 | 10/2016 | Mikamo |
| 2018/0216965 A1* | 8/2018 | Richard ............. G01D 5/24485 |
| 2018/0231400 A1* | 8/2018 | Okumura ............. G01D 5/2454 |
| 2018/0356252 A1 | 12/2018 | Diegel et al. |
| 2019/0310113 A1 | 10/2019 | Riedmueller et al. |
| 2019/0323819 A1 | 10/2019 | Zimmer et al. |
| 2019/0346287 A1 | 11/2019 | Koike et al. |
| 2019/0351940 A1 | 11/2019 | Kozuka et al. |
| 2020/0025842 A1 | 1/2020 | Baumann et al. |
| 2020/0062300 A1 | 2/2020 | Kuwahara et al. |
| 2022/0048559 A1 | 2/2022 | Gorbold et al. |

FOREIGN PATENT DOCUMENTS

| | | |
|---|---|---|
| EP | 2 912 411 B1 | 4/2017 |
| EP | 3 451 526 | 5/2020 |
| JP | 2012-230021 | 11/2012 |
| JP | 5315212 B2 | 10/2013 |
| JP | 6616414 B2 | 12/2019 |
| JP | 2020-003316 | 1/2020 |
| JP | 2020003316 A | 1/2020 |
| WO | WO 16/014193 | 1/2016 |

\* cited by examiner

SYSTEMS AND METHODS FOR DETECTING MAGNETIC TURN COUNTER ERRORS

FIELD OF THE DISCLOSURE

Embodiments of the invention relate to electronic systems, and more particularly to, systems and methods for detecting sensor errors through magnetic turn counter sensing elements.

BACKGROUND

Magnetic sensors can be implemented to obtain linear or circular position or angle information of a mechanical component, such as a shaft, in various applications, including an automotive steering system. Magnetic sensing elements used in magnetic angle sensors often suffer from changing sensitivity levels and non-linearity errors due to, for example, temperature change, and it is desirable to implement sensor error detection mechanism for magnetic sensors.

SUMMARY OF THE DISCLOSURE

The methods and devices of the described technology each have several aspects, no single one of which is solely responsible for its desirable attributes.

In one aspect, there is provided a magnetic field turn sensor system, comprising: a magnetic field angle sensor; a signal processing path configured to receive an output from the magnetic field angle sensor and generate an angle measurement based on the output; a turn count path configured to process the output from the magnetic field angle sensor and output a quadrant measurement based on the output; and a processor configured to: receive the quadrant measurement from the turn count path, determine that the quadrant measurement is indicative of a transition between quadrants, obtain an expected transition angle at which the quadrant measurement is indicative of the transition between quadrants, receive the angle measurement from the signal processing path, determine that the angle measurement deviates from the expected transition angle by more than a threshold value, and indicate a fault in response to determining that the angle measurement deviates from the expected transition angle by more than the threshold value.

The magnetic field angle sensor can comprise a first magnetic field angle sensor, the signal processing path comprises a first signal processing path, and the angle measurement comprises a first angle measurement, the system further comprising: a second magnetic field angle sensor; and a second signal processing path configured to receive an output from the second magnetic field angle sensor and generate a second angle measurement based on the output, wherein the processor is further configured to: receive the second angle measurement from the second signal processing path, determine that the first angle measurement differs from the second angle measurement by greater than a threshold angle, and indicate the fault in response to determining that the first angle measurement differs from the second angle measurement by greater than the threshold angle.

The processor can be further configured to: determine that the angle measurement does not deviate from the expected transition angle by more than the threshold value, and refrain from indicating the fault in response to determining that the angle measurement does not deviate from the expected transition angle by more than the threshold value.

The system can further comprise: a memory configured to store the expected transition angle, wherein the obtaining of the expected transition angle further comprises retrieving the expected transition angle from the memory.

The processor can be further configured to: store a plurality of historical values of the angle measurement in the memory, and determine the expected transition angle based on the historical values of the angle measurement.

The processor can be further configured to: for the transition between quadrants, average the historical values of the angle measurement corresponding to the transition between quadrants, and set the average of the historical values as the expected transition angle corresponding to the transition between quadrants.

The processor can be further configured to: in response to starting up from a low-power mode, compare a quadrant corresponding to the angle measurement to the quadrant measurement, determine that the quadrant corresponding to the angle measurement does not match the quadrant measurement, and indicate the fault in response to determining that the quadrant corresponding to the angle measurement does not match the quadrant measurement.

The processor can be further configured to: determine that the angle measurement deviates from an expected range of angles corresponding to the quadrant measurement by more than a threshold value, and indicate the fault in response to determining that the angle measurement deviates from the expected range of angles by more than the threshold value.

In another aspect, there is provided a motor control system configured to control a vehicle, comprising: a shaft connected to a steering wheel of the vehicle; and a magnetic field turn sensor system comprising: a magnetic field angle sensor, a signal processing path configured to receive an output from the magnetic field angle sensor and generate an angle measurement based on the output, and a turn count path configured to process the output from the magnetic field angle sensor and output a quadrant measurement based on the output, and a processor configured to: receive the quadrant measurement from the turn count path, determine that the quadrant measurement is indicative of a transition between quadrants, obtain an expected transition angle at which the quadrant measurement is indicative of the transition between quadrants, receive the angle measurement from the signal processing path, determine that the angle measurement deviates from the expected transition angle by more than a threshold value, and indicate a fault in response to determining that the angle measurement deviates from the expected transition angle by more than the threshold value.

The magnetic field angle sensor can comprise a first magnetic field angle sensor, the signal processing path comprises a first signal processing path, and the angle measurement comprises a first angle measurement, the system further comprising: a second magnetic field angle sensor; and a second signal processing path configured to receive an output from the second magnetic field angle sensor and generate a second angle measurement based on the output, wherein the processor is further configured to: receive the second angle measurement from the second signal processing path, determine that the first angle measurement differs from the second angle measurement by greater than a threshold angle, and indicate the fault in response to determining that the first angle measurement differs from the second angle measurement by greater than the threshold angle.

The processor can be further configured to: determine that the angle measurement does not deviate from the expected transition angle by more than the threshold value, and refrain from indicating the fault in response to determining that the angle measurement does not deviate from the expected transition angle by more than the threshold value.

The system can further comprise: a memory configured to store the expected transition angle, wherein the obtaining of the expected transition angle further comprises retrieving the expected transition angle from the memory.

The processor can be further configured to: store a plurality of historical values of the angle measurement in the memory, and determine the expected transition angle based on the historical values of the angle measurement.

The processor can be further configured to: for the transition between quadrants, average the historical values of the angle measurement corresponding to the transition between quadrants, and set the average of the historical values as the expected transition angle corresponding to the transition between quadrants.

The processor can be further configured to: in response to starting up from a low-power mode, compare a quadrant corresponding to the angle measurement to the quadrant measurement, determine that the quadrant corresponding to the angle measurement does not match the quadrant measurement, and indicate the fault in response to determining that the quadrant corresponding to the angle measurement does not match the quadrant measurement.

The processor can be further configured to: determine that the angle measurement deviates from an expected range of angles corresponding to the quadrant measurement by more than a threshold value, and indicate the fault in response to determining that the angle measurement deviates from the expected range of angles by more than the threshold value.

In yet another aspect, there is provided a method for detecting errors in a magnetic field turn sensor system, comprising: receiving a quadrant measurement from a turn count path of the magnetic field turn sensor system, the magnetic field turn sensor system comprising a magnetic field angle sensor, a signal processing path configured to receive an output from the magnetic field angle sensor and generate the angle measurement based on the output, and the turn count path configured to process the output from the magnetic field angle sensor and output the quadrant measurement based on the output; determining that the quadrant measurement is indicative of a transition between quadrants; obtaining an expected transition angle at which the quadrant measurement is indicative of the transition between quadrants; receiving the angle measurement from the signal processing path, determining that the angle measurement deviates from the expected transition angle by more than a threshold value; and indicating a fault in response to determining that the angle measurement deviates from the expected transition angle by more than the threshold value.

The magnetic field angle sensor can comprise a first magnetic field angle sensor, the signal processing path comprises a first signal processing path, and the angle measurement comprises a first angle measurement, and the magnetic field turn sensor system further comprises: a second magnetic field angle sensor, and a second signal processing path configured to receive an output from the second magnetic field angle sensor and generate a second angle measurement based on the output, the method further comprising: receiving the second angle measurement from the second signal processing path; determining that the first angle measurement differs from the second angle measurement by greater than a threshold angle; and indicating the fault in response to determining that the first angle measurement differs from the second angle measurement by greater than the threshold angle.

The method can further comprise: determining that the angle measurement does not deviate from the expected transition angle by more than the threshold value; and refraining from indicating the fault in response to determining that the angle measurement does not deviate from the expected transition angle by more than the threshold value.

The method can further comprise: in response to starting up from a low-power mode, comparing a quadrant corresponding to the angle measurement to the quadrant measurement; determining that the quadrant corresponding to the angle measurement does not match the quadrant measurement; and indicating the fault in response to determining that the quadrant corresponding to the angle measurement does not match the quadrant measurement.

BRIEF DESCRIPTION OF THE DRAWINGS

These drawings and the associated description herein are provided to illustrate specific embodiments of the invention and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Overview of Magnetic Field Turn Sensor System

Figure 1A:
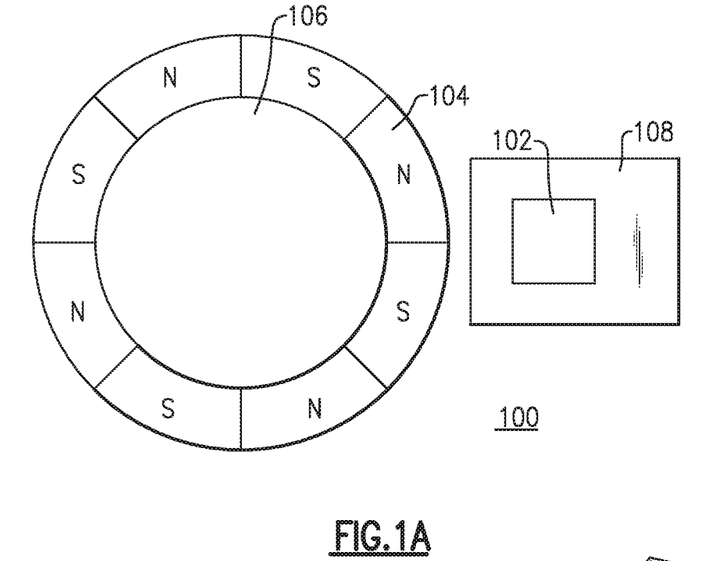
FIGS. 1A and 1B are schematic diagrams of example implementations of an error detecting system according to certain embodiments.
Figure 1B:
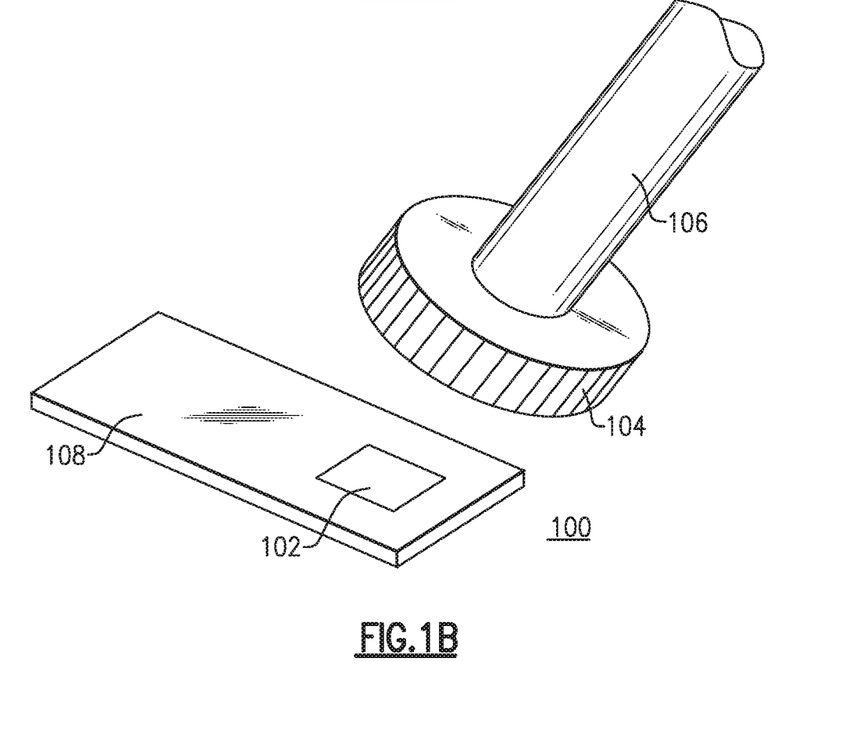

FIGS. 1A and 1B are schematic diagrams of example implementations of an error detecting system according to certain embodiments. The illustrated implementation 100 includes a shaft 106, a magnet 104, a magnetic field turn sensor system or sensing circuit 102, and a circuit board 108. Embodiments of the sensing circuit 102 are further described in connection with FIGS. 2-3 below. The magnet 104 can be attached to the rotating shaft 106. The rotating shaft 106 can be associated with a steering wheel of a motor vehicle in certain implementations. The sensing circuit 102 can sense changes in position of the magnet 104 and provide an indication of rotation of the rotating shaft 106. A position relationship between the sensing circuit 102 and the magnet 104 illustrated in FIGS. 1A and 1B is for illustration purposes. In another embodiment, the implementation can use an end-of-shaft configuration where the magnet 104 can be a dipole magnet located at the end of the shaft 106 and the sensing circuit 102 can be located under the magnet 104. The position relationship can vary. In one embodiment, the sensing circuit 102 can comprise two sensors, i.e., a first sensor and a second sensor. The second sensor can be the same as or different from the first sensor. For example, the second sensor can use different sensing principle and different signal chain design to ensure robustness.

In embodiments, magnetic sensors such as anisotropic magnetoresistive (AMR) sensors, giant magnetoresistive (GMR), or tunneling magnetoresistive (TMR) sensors, or any other suitable magnetoresistive (XMR) sensors can be used to implement the disclosed apparatus and/or methods. In some embodiments, the magnetic sensors can measure the change in resistivity that is proportional to the magnetization direction of a free layer in the magnetoresistive sensor. By using magnetic sensors, such as AMR sensors and TMR sensors, and various combinations of sensing elements of the magnetic sensor, error(s) can be detected.

In certain motor control applications, it is beneficial to monitor the number of turns through which the shaft 106 rotates, even when the motor controller is powered off. Such systems can occur where there is a possibility of the shaft 106 being moved by an external force while the system is powered off. To address this challenge, a low-power circuit (which can be included as a portion of the sensing circuit 102) can be configured to continuously monitor the rotation of the shaft 106 while the rest of the motor control system is powered down.

An example of a system for which it can be beneficial to monitor the rotation or number of turns of a shaft 106 is and Electric Power Assisted Steering (ePAS) system in an automobile. In many ePAS systems, the shaft 106 angle is monitored as part of a motor control function when the system is normally operating. A low-power sensing circuit 102 can also used to keep track of shaft 106 turns during normal operation.

The number of turns through which the motor shaft 106 has rotated may be a critical variable for certain vehicle functions. For example, errors in a turn count measurement for a steering wheel shaft can result in detection of an incorrect steering angle, which can lead to a hazardous situation. Therefore, it can be important to correctly measure the turn count, and that flag any errors in angle measurement to the motor control system. Providing diagnostic coverage to a low-power turn counter is difficult because typical diagnostic techniques may consume additional power. For example, low power rotation sensing circuits 102 may have a limited power consumption budget since consuming too much power while the automobile is off may prematurely drain the automobile battery. Thus, adding error detection diagnostics which consume too much additional power can result in the power usage of the sensing circuits 102 exceeding the power consumption budget.

In this disclosure, the sensing circuit 102 can use angle measurements from one of more signal processing paths to monitor transition angles between quadrants measured by the sensing circuit. Errors in the components of the sensing circuit 102 can be detected by comparing the measured transition angles to expected transition angles. For example, certain errors in the components of the sensing circuit 102 will affect the specific angles at which the sensing circuit 102 transitions between quadrants, which can be detected by comparing the measured transition angles to predetermined expected transition angles.

Aspects of this disclosure can be implemented in a magnetic angle sensor including, for example, the sensing circuit 102. Such a magnetic sensor can include AMR sensing elements and TMR sensing elements, signal conditioning electronics and an interface. Depending on the implementation, the interface may include one or more of the following: serial peripheral interface (SPI), single edge nibble transmission (SENT) interface, peripheral acceleration sensor (PAS) interface, such as PAS4, etc. In one application, the interface can be a PAS interface, such as a PAS4 interface for remote accelerometers used for airbag deployment in vehicles, for communication with a host electronic control unit (ECU). The magnetic angle sensor can be implemented in an automotive ePAS system. Such a system has a functional safety specification defined in accordance with ISO-26262, which is a functional safety standard for road vehicles. The principles and advantages discussed herein can be implemented to detect errors in the turn count measurements of the shaft 106 (e.g., which may be associated with a steering wheel) while the sensing circuit 102 is operating in low-power mode in an ePAS system to satisfy a functional safety specification. In other instances, the illustrated implementation 100 can be used in other systems complying with other specifications or standards, or systems requiring error detection in low-power turn count applications.

As described herein, the magnetic sensor typically includes two full bridges, e.g., a cosine bridge and a sine bridge. Each of the cosine bridge and the sine bridge outputs voltages, i.e., $V_{COS}$ and $V_{SIN}$, respectively. For example, in AMR sensor using single dipole magnet, "electrical angle" can be understood as the angle calculated from arctan ($V_{SIN}/V_{COS}$), and "magnetic angle," that is expressed as $ANGLE_{MAG}$ herein, can be calculated by dividing the "electric angle" by two (2). For an AMR where the two bridges are rotated at approximately 45° from each other, the outputs of the two bridges are sinusoidal with a relative phase shift of approximately 90°, and the sensor's electrical response is twice the magnetic angle. In another example, for a TMR sensor, the "electric angle" can be same as the "magnetic angle." Further, "mechanical angle" can be understood as the angle determined based on the magnet design, which can be reflected in a mechanical-to-magnetic angle transfer function. The "mechanical angle" and "magnetic angle" can be the same or different from each other. For example, in embodiments using a single pole-pair magnet, the "mechanical angle" and "magnetic angle" are the same. In embodiments using a multi-pole magnet, such a pole-ring, the "mechanical angle" can be expressed as ($ANGLE_{MAG}/N$), where N is the number of pole pairs.

In some embodiments, the systems and methods disclosed herein may be applied to an apparatus having a rotating shaft, which may include one or more magnetic elements such as dipole or ring magnets. A measurement of the magnetic field by the sensing elements can be used to determine the angle of rotation of the shaft.

Examples of Magnetic Field Turn Sensor Systems and Error Detection Techniques

Figure 2A:
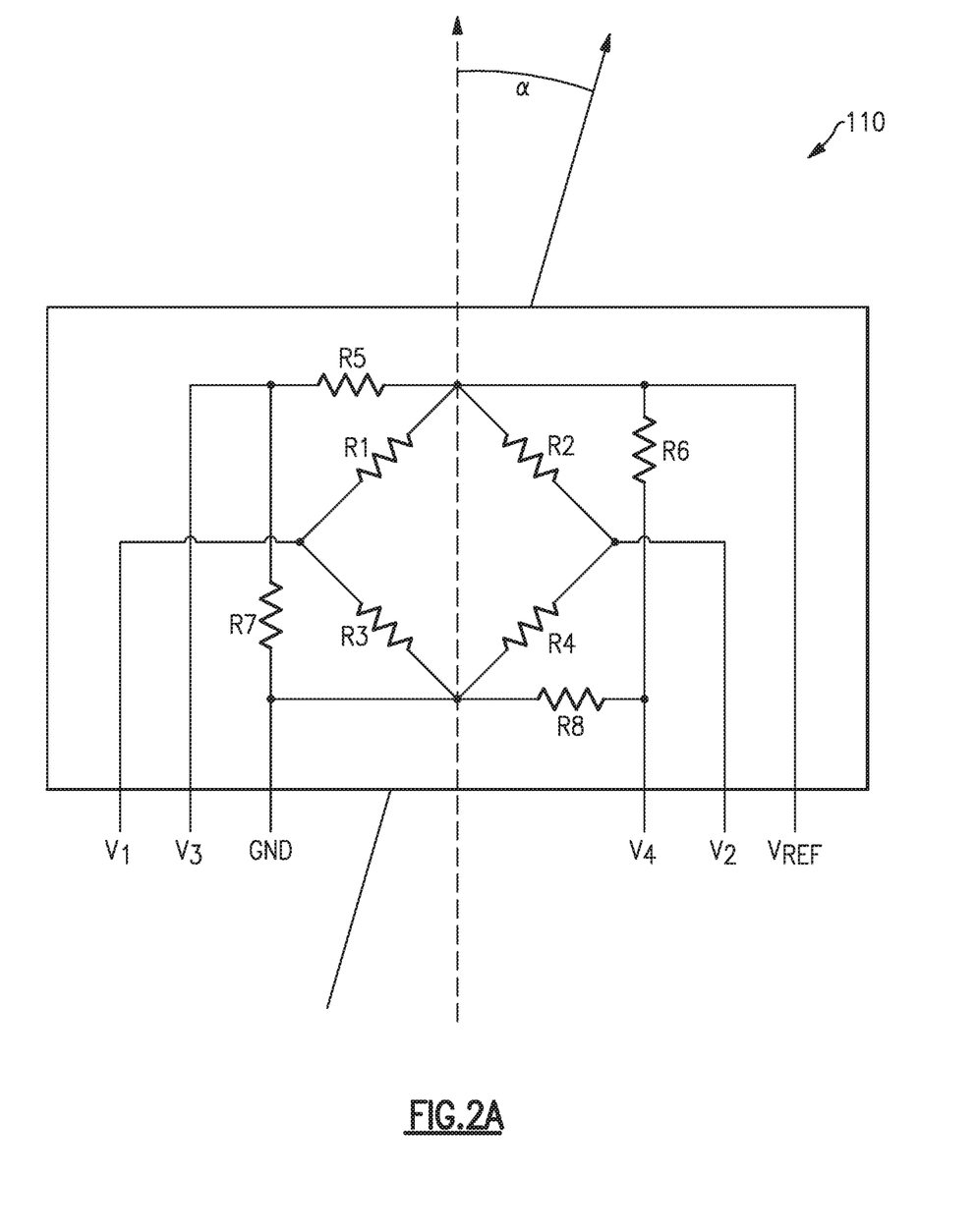
FIG. 2A shows a diagram of example implementation of a first sensor according to one embodiment.

FIG. 2A shows a diagram of example implementation of a first sensor 110 according to one embodiment. A first sensor 110 comprises one or more half bridges. Sensors 110 including two or more half bridges can be configured as one or more full bridges. The example first sensor 110 illustrated in FIG. 2A includes eight sensing elements R1-R8 that are configured as a system of four half bridges. As illustrated in FIG. 2A, the first sensor 110 includes sensing elements R1 and R3 forming a first half bridge having an output V1; sensing elements R2 and R4 forming a second half bridge having a second output V2; sensing elements R5 and R7 forming a third half bridge having an output V3; and sensing elements R6 and R8 forming a fourth half bridge having an output V4.

A plurality of half bridges (or full bridges which are paired half bridges) of the half bridge system can be oriented at an angle relative to one another and configured to be sensitive to magnetic fields in different directions. In FIG. 2A, the full bridge including sensing elements R1-R4 and the full bridge including sensing elements R5-R8 are oriented an angle α relative to each other. In the illustrated embodiment, α=approximately 45°. In an embodiment, each of the two-paired half bridges (which are full bridges) can form individual channels, i.e., first channel and second channel, each of which is a path between the first sensor and an interface. Here, one full bridge can correspond to a cosine bridge and the other bridge can correspond to a sine bridge. For example, the cosine bridge can comprise the sensing elements R1-R4, the sine bridge can comprise the sensing elements R5-R8, where $V2-V1=V_{COS}$ and $V4-V3=V_{SIN}$. One bridge of the sine and the cosine bridges can be included in the first channel, which is a first path from the first sensor 110 to an interface. The other of the sine and cosine bridges can be included in the second channel, which is a second path from the first sensor 110 to the interface. The first path is different from the second path. In other embodiments, the system of half bridges may include more or fewer half bridges than the embodiment illustrated in FIG. 2A.

Figure 2B:
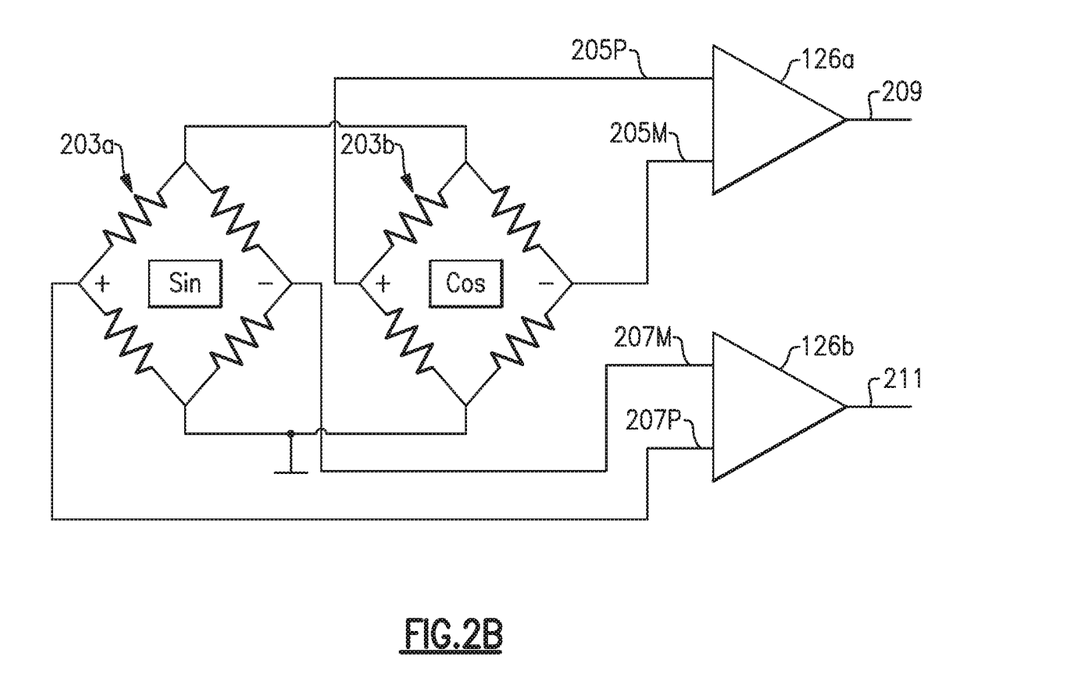
FIG. 2B is a block diagram illustrating a configuration of a plurality of comparators that can be used to determine the quadrant in which the angle of the shaft is current located in accordance with aspects of this disclosure.

FIG. 2B is a block diagram illustrating a configuration of a plurality of comparators 126 that can be used to determine the quadrant in which the angle of the shaft 106 is current located in accordance with aspects of this disclosure. For example, the configuration illustrates a sine full bridge 203a and a cosine full bridge 203b, which may be similar to the full bridges illustrated in FIG. 2A. The sine bridge 203a is configured to generate a positive output 207P and a negative output 207M and the cosine bridge 203b is also configured to generate a positive output 205P and a negative output 205M. The outputs 205P, 205M, 207P, and 207M from the sine and cosine bridges 203a and 203b will vary depending on the current orientation of the shaft 106. In more detail, the positive and negative outputs 205P and 205M from the cosine bridge 203b are provided to a first comparator 126a while the positive and negative outputs 207P and 207M from the sine bridge 203a are provided to a second comparator 126b.

Figure 2C:
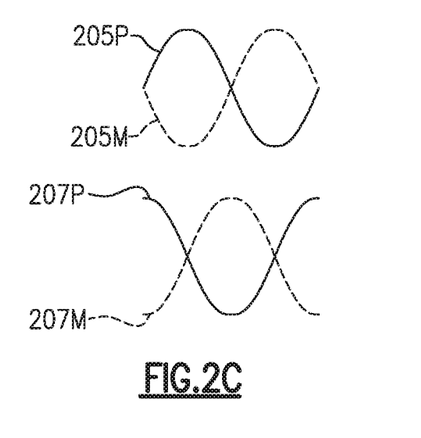
FIGS. 2C and 2D illustrate an example of the first and second outputs from the sine and cosine bridges which are supplied to the first and second comparators in accordance with aspects of this disclosure.
Figure 2D:
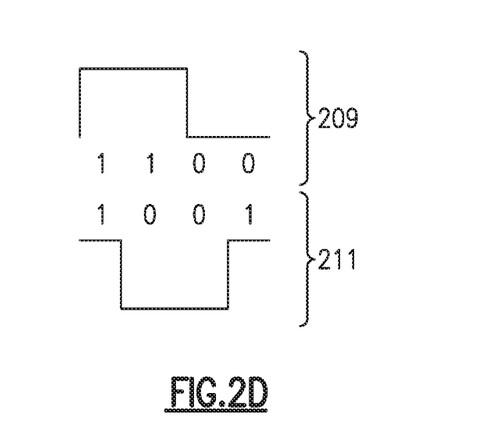

FIGS. 2C and 2D illustrates an example of the outputs 205P, 205M, 207P, and 207M from the sine and cosine bridges 203a and 203b which are supplied to the first and second comparators 126a and 126b in accordance with aspects of this disclosure. As shown in FIG. 2C, each of the outputs 205P, 205M, 207P, and 207M varies as the shaft 106 is rotated through 360°. Taking the positive and negative outputs 205P and 205M from the cosine bridge 203b as an example, the outputs 205P and 205M cross each other as the shaft 106 is rotated at two points separated by 180°. The positive and negative outputs 207P and 207M from the sine bridge 203a also cross each other at two points separated by 180° which are offset from the outputs 205P and 205M from the cosine bridge 203b by 90°. With reference to FIGS. 2B and 2D, the first comparator 126a compares the values of the outputs 205P and 205M from the cosine bridge 203a to produce a first digital output 209 (which is illustrated in both signal and digital representations) and the second comparator 126b compares the values of the outputs 207P and 207M from the sine bridge 203b to provide a second digital output 211 (also shown in signal and digital representations). A processor can use the first and second digital outputs 209 and 211 to identify which quadrant in which the angle of the shaft is currently located.

Figure 3:
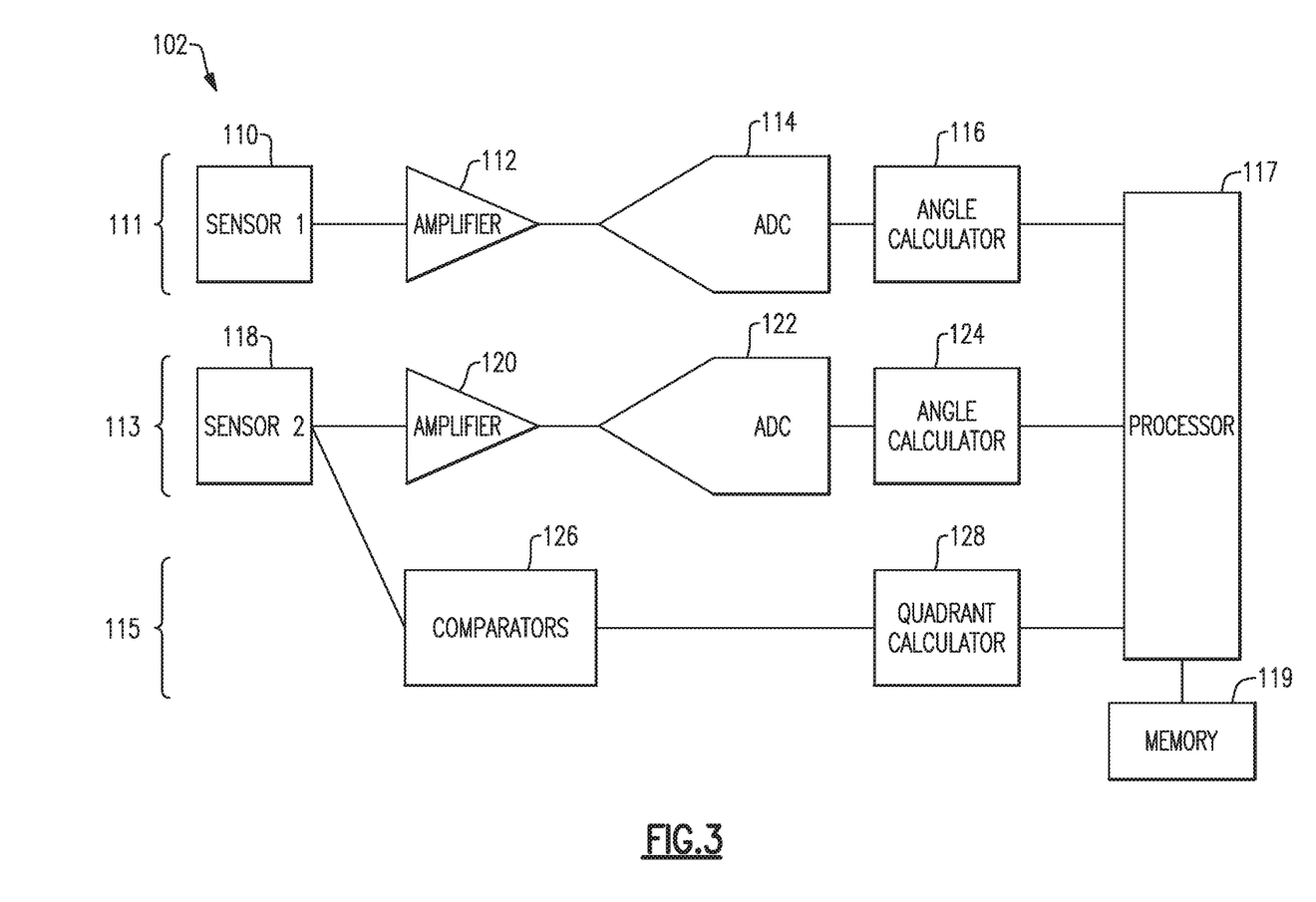
FIG. 3 is a block diagram of an example implementation of a magnetic field turn sensor system configured to detect errors in turn count according to aspects of this disclosure.

FIG. 3 is a block diagram of an example implementation of a magnetic field turn sensor system 102 configured to detect errors in turn count according to aspects of this disclosure. In particular, the magnetic field turn sensor system 102 includes a first signal processing path 111, a second signal processing path 113, a turn count path 115, a processing unit 117 connected to each of the first and second signal processing paths 111 and 113 and the turn count path 115, and a memory 119. The first signal processing path 111 includes a first sensor 110, an amplifier 112, an analog-to-digital converter (ADC) 114, and an angle calculator 116. The second signal processing path 113 includes a second sensor 118, an amplifier 120, an ADC 122, and an angle calculator 124. In certain embodiments, the components of the first and second signal processing paths 111 and 113 may be substantially the same. Additionally, in some implementations, each of the first and second signal processing paths 111 and 113 may include a pair of amplifiers 112 and 120 and a pair of ADCs 114 and 122. The turn count path 115 includes one or more comparator(s) 126 and a quadrant calculator 128. As shown in FIG. 3, the comparator(s) 126 are configured to receive an output from the second sensor 118 of the second signal processing path 113. However, in other embodiments, the comparator(s) 126 may be configured to receive an output from the first sensor 110 or from both of the first and second sensors 110 and 118.

The memory 119 can be configured to store an expected transition angle at which the turn count path 115 will transition between quadrants. In some embodiments, the memory 119 can also be configured to store historical values of the angles at which the turn count path 115 transitions between quadrants. The expected transition angle can be used to detect error(s) in the comparator(s) 126, which is described in detail herein.

The processor 117 is configured to receive an angle measurement from each of the first and second processing paths 111 and 113 and a quadrant measurement from the turn count path 115. The processor 117 can determine an angle of the shaft 106 based on the angle measurements received from the first and second processing paths 111 and 113. The processor 117 can also determine a turn count (e.g., a number of turns that the shaft 106 has been rotated with respect to a neutral position which may be defined as a "zero" turn position) by tracking the quadrant measurement from the turn count path 115 over time.

There are a number of potential locations at which errors may occur within the magnetic field turn sensor system 102. Specifically, errors which may ultimately affect the turn count determined by the processor 117 include error(s) occurring in: the second sensor 118, the comparator(s) 126, and/or the quadrant calculator 128. Accordingly, in order for the processor 117 to flag potential errors in the turn count to the motor control system, aspects of this disclosure relate to systems and techniques that can be used to detect each of the above sources of error.

To detect potential error(s) in the second sensor 118 and/or certain errors in the quadrant calculator 128, the processor 117 can be configured to exploit the redundancy of the first and second signal processing paths 111 and 113. For example, if the magnetic field turn sensor system 102 is operating without error, the angle measurements provided by each of the first and second signal processing paths 111 and 113 should be the same or approximately the same. Thus, in the event that an error (e.g., an offset) has occurred in the second sensor 118, the angle measurements provided by the first and second signal processing paths 111 and 113 will diverge. For example, an offset may refer to a fixed difference between the measured angle and the actual angle, irrespective of the actual angle. In some circumstances, a voltage offset on one of the half bridge outputs 205P, 205M, 207P, and 207M can change the differential voltage output of the bridge and cause an angle error. An offset may also be caused by a defect in one or more of the bridge elements R1-R8.

Another example error which can occur is a gain error which may refer to a difference between the actual angle and measured angle, which may increase linearly with actual angle. In some cases, a gain error may affect one of the bridge paths, such that the cosine bridge outputs 205P and 205M and the sine bridge outputs 207P and 207M have different amplitudes, or a defect causing an open in a bridge output, which can make it appear that the direction of rotation has changed. Yet another example error which can occur is a nonlinearity is a difference between the measured and actual angle which varies non-linearly with actual angle. Still yet another example error includes a timing error controlling the calibration of one or more bridge signal processing paths 111 and 113 which can cause calibration to be misapplied.

Figure 4:
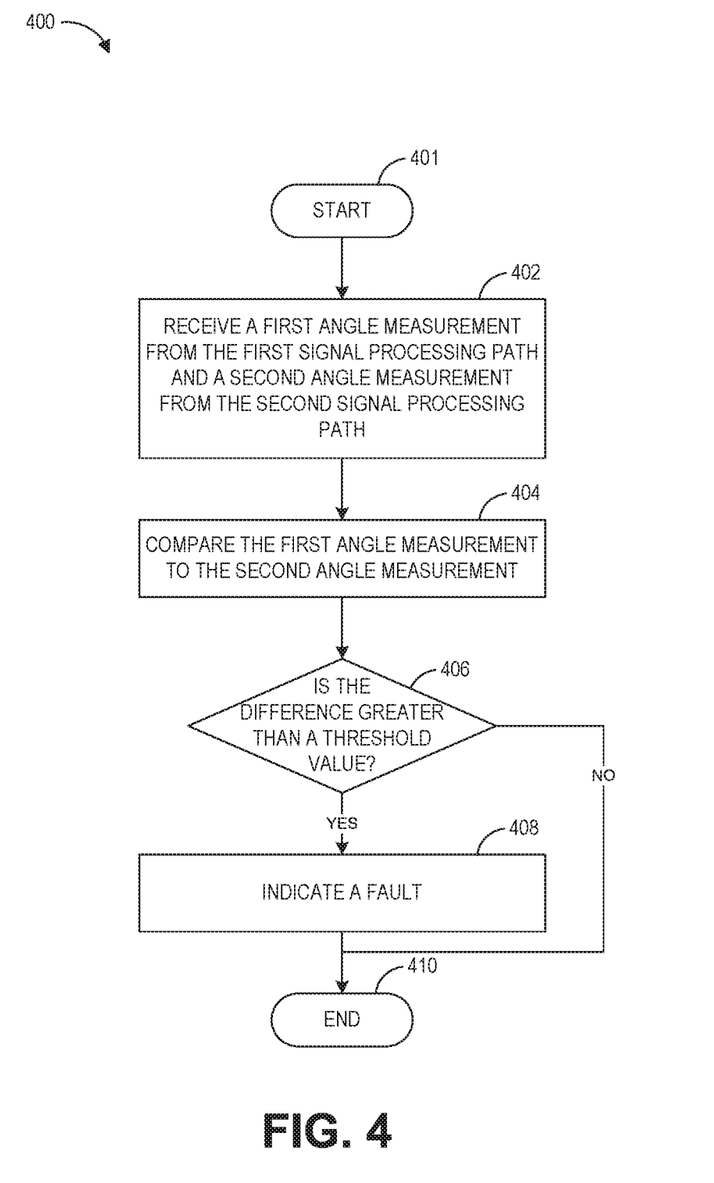
FIG. 4 is a flowchart of an example implementation of a method for detecting errors in the second sensor in accordance with aspects of this disclosure.

FIG. 4 is a flowchart of an example implementation of a method 400 for detecting errors in the second sensor 118 in accordance with aspects of this disclosure. The method 400 may be performed by the processor 117 of the magnetic field turn sensor system 102. However, in other embodiments, certain blocks of the method 400 may instead be performed by other components which may be located, for example, on the circuit board 108. In some embodiments in which the turn count path 115 receives output from each of the first sensor 110 and the second sensor 118, the method 400 may be modified to detect error(s) in both of the first and second sensors 110 and 118.

The method 400 begins at block 401. At block 402, the processor 117 receives a first angle measurement from the first signal processing path 111 and a second angle measurement from the second signal processing path 113. At block 404, the processor 117 compares the first and second angle measurements to each other. At block 406, the processor 117 determines whether the difference between the first and second angle measurements is greater than a threshold value.

In response to the difference between the first and second angle measurements being greater than a threshold value, the method 400 proceeds to block 408, at which the processor indicates a possible fault in the angle measurements. That is, if the individual measurements of the angle of the shaft 106 as determined by the first and second signal processing paths 111 and 113 differ by more than a threshold value, the processor 117 can flag this inconsistency as potentially indicating that there is an error in one of the first and second sensors 110 and 118. When the automobile is turned on, the motor control system can receive the fault from the processor 117 of the magnetic field turn sensor system 102 and take one or more actions to mitigate potential errors in the turn count sensor.

In response to the difference between the first and second angle measurements being less than a threshold value, the method 400 proceeds to block 410, at which the method 400 ends. In some implementations, the method 400 may be performed in a loop such that the method 400 returns to block 401 after ending at block 410 such that a new set of angle measurements can be compared.

In addition to detecting potential error(s) in the second sensor 118, the magnetic field turn sensor system 102 can be configured to detect potential error(s) in the comparator(s) 126 by detecting whether the angle(s) at which the shaft 106 transitions between quadrants deviates from expected transition angle(s). In particular, when there are no errors in the magnetic field turn sensor system 102, the specific quadrant measurement as determined by the turn count path 115 as the shaft 106 rotates will transition from a current quadrant to an adjacent quadrant at a known and repeatable angle (e.g., an expected transition angle). However, if there are error(s) in the comparator(s) 126, the specific angle at which the turn count path 115 detects a transition between quadrants will deviate from the expected transition angle. Thus, by detecting a deviation between the angle at which the transition between quadrants occurs and the expected transition angle, the magnetic field turn sensor system 102 can determine that there is an error in one or more of the comparators 126.

The quadrant measurement output from the turn count path 115 can be used by the processor 117 to determine the turn count of the shaft 106 while the motor control system (e.g., used to control a motor vehicle) is powered off. It is important for safety of the motor control system to track rotation of the shaft 106 while the system is powered off such that upon powering the system on, the system can rely on the turn count provided by the magnetic field turn sensor system 102. For example, if the shaft 106 connected to the vehicle's steering wheel were to be rotated 360° while the motor control system is powered off, without knowledge of this rotation, the steering angle commanded by the motor control system would deviate from the intended position of the steering wheel due to the undetected rotation of the shaft 106.

In some embodiments, to determine that the magnetic field turn sensor system 102 is functional at start up, the processor 117 can compare the turn count quadrant received from the quadrant calculator 128 to the quadrant corresponding to the angle received from the angle calculators 116 and 124 to ensure that the two quadrants match. For example, if the turn quadrant calculator 128 reports quadrant 3 (or octant 3a in the case that octants are output) and the angle calculators 116 and 124 report angles that are within quadrant 3 (or octant 3a), then the processor 117 will not generate a fault. In contrast, if the angle calculators 116 and 124 report angles that do not fall within quadrant 3 (or octant 3a), then the processor 17 will generate a fault, which may be interpreted as a fault within the quadrant calculator 128.

Figure 5:
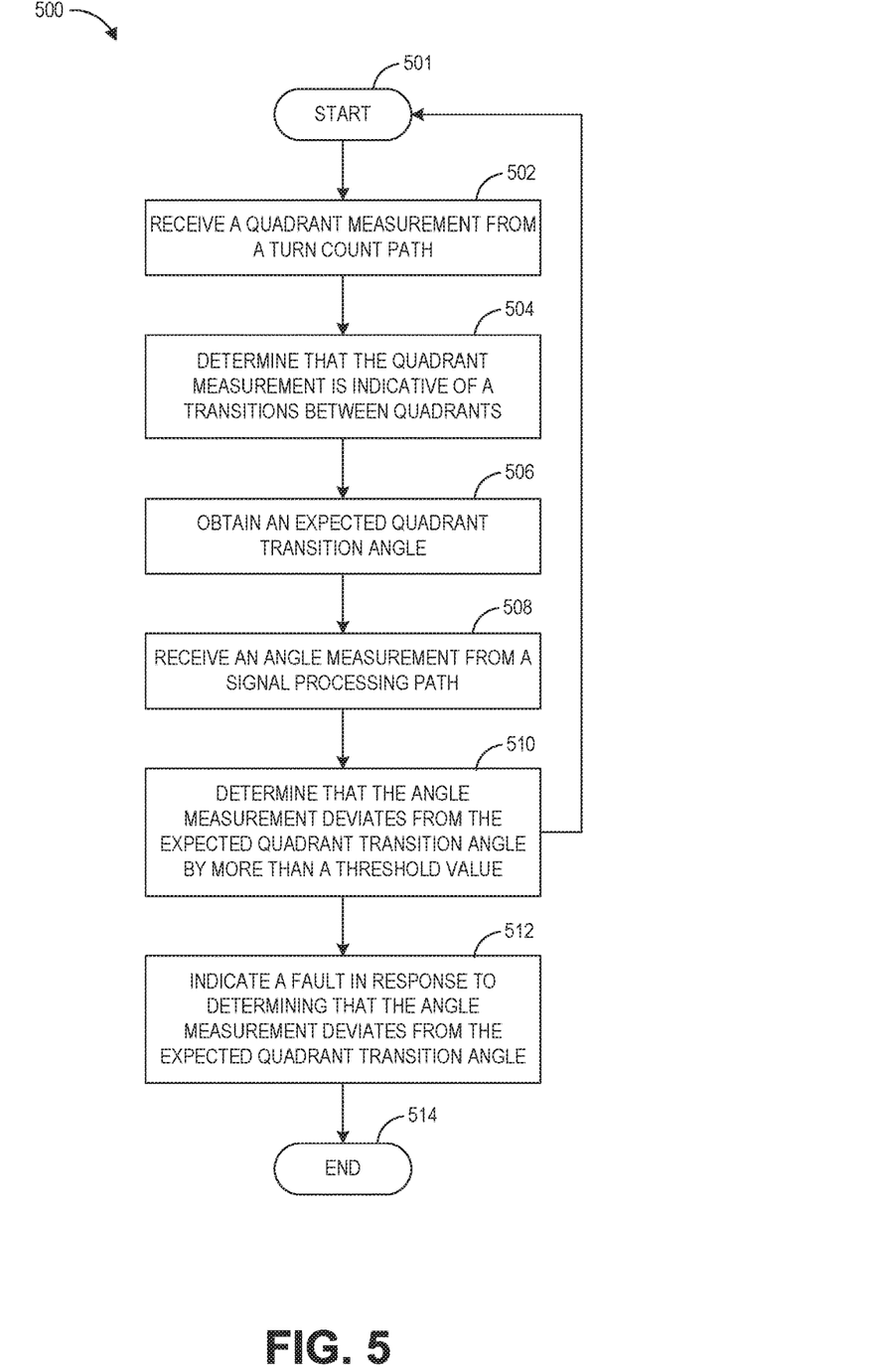
FIG. 5 is a flowchart of an example implementation of a method for detecting errors in the comparator(s) in accordance with aspects of this disclosure.

FIG. 5 is a flowchart of an example implementation of a method 500 for detecting errors in the comparator(s) 126 in accordance with aspects of this disclosure. The method 500 may be performed by the processor 117 of the magnetic field turn sensor system 102. However, in other embodiments, certain blocks of the method 500 may instead be performed by other components which may be located, for example, on the circuit board 108.

The method 500 begins at block 501. At block 502, the processor 117 receives a quadrant measurement from a turn count path 115. Depending on the embodiment, the magnetic field turn sensor system 102 can include a single signal processing path 113 or a first signal processing path 111 and a second signal processing path 113. The turn count path 115 is configured to receive output from a magnetic field angle sensor of at least one of the first and second signal processing paths 111 and 113.

At block 504, the processor 117 determines that the quadrant measurement is indicative of a transition between quadrants. For example, in some embodiments, the processor 117 can determine that the quadrant measurement indicates a different quadrant with respect to a previously received quadrant measurement, and thus, that the shaft 106 has transitioned between quadrants. As described above, the quadrant calculator 128 can output the quadrant measurement to the processor 117 based on the first and second digital outputs 209 and 211 received from the comparators 126.

At block 506, the processor 117 obtains an expected transition angle at which the quadrant measurement is indicative of the transition between quadrants. In some implementations, the processor 117 can obtain the expected transition angle from the memory 119. For example, the memory 119 can store the expected transition angle which may be preprogrammed into the memory 119 based on the characteristics of the magnetic field turn sensor system 102. In some embodiments, the expected transition angle can be hard coded into digital logic. In certain implementations, the processor 117 may store historical values of quadrant transition angles in the memory 119 as the shaft 106 is rotated. For example, the processor 117 may store the angle measurements received from the first and second signal processing paths 111 and 113 in the memory 119 as historical transition angles when the turn count path 115 indicates a transition between quadrants. The processor 117 can use the stored historical transition angles to determine the expected transition angles. In some embodiments, the processor 117 may average the historical transition angles for a given transition between quadrants to determine a corresponding expected transition angle. Advantageously, storing the historical values of quadrant transition angles can allow for drift in the system over time to be adjusted for. However, aspects of this disclosure are not limited to using an average of the historical transition angles and the processor 117 can determine the expected transition angle using other techniques (e.g., determining a mean value).

At block 508, the processor 117 receives an angle measurement from a signal processing path (e.g., from at least one of the first signal processing path 111 and the second signal processing path 113). At block 510, the processor 117 determines that the angle measurement deviates from the expected transition angle by more than a threshold value, which may be stored in memory 119 in certain embodiments. For example, the processor 117 can compare the angle measurement to the expected transition angle and determine whether the difference between the angle measurement and the expected transition angle is greater than the threshold value. If the difference is less than the threshold value, the processor 117 can determine that no error has occurred in the comparators 126 and return to block 501. However, if the difference is greater than the threshold value, the processor 117 can continue to block 510.

At block 512, the processor 117 indicates a fault in response to determining that the angle measurement deviates from the expected transition angle by more than the threshold value. The processor 117 can provide the indication of the fault to the motor control system, which can in turn take one or more actions to mitigate potential errors in the turn count sensor when the vehicle is turned on. The method 500 ends at block 514.

Figure 6:
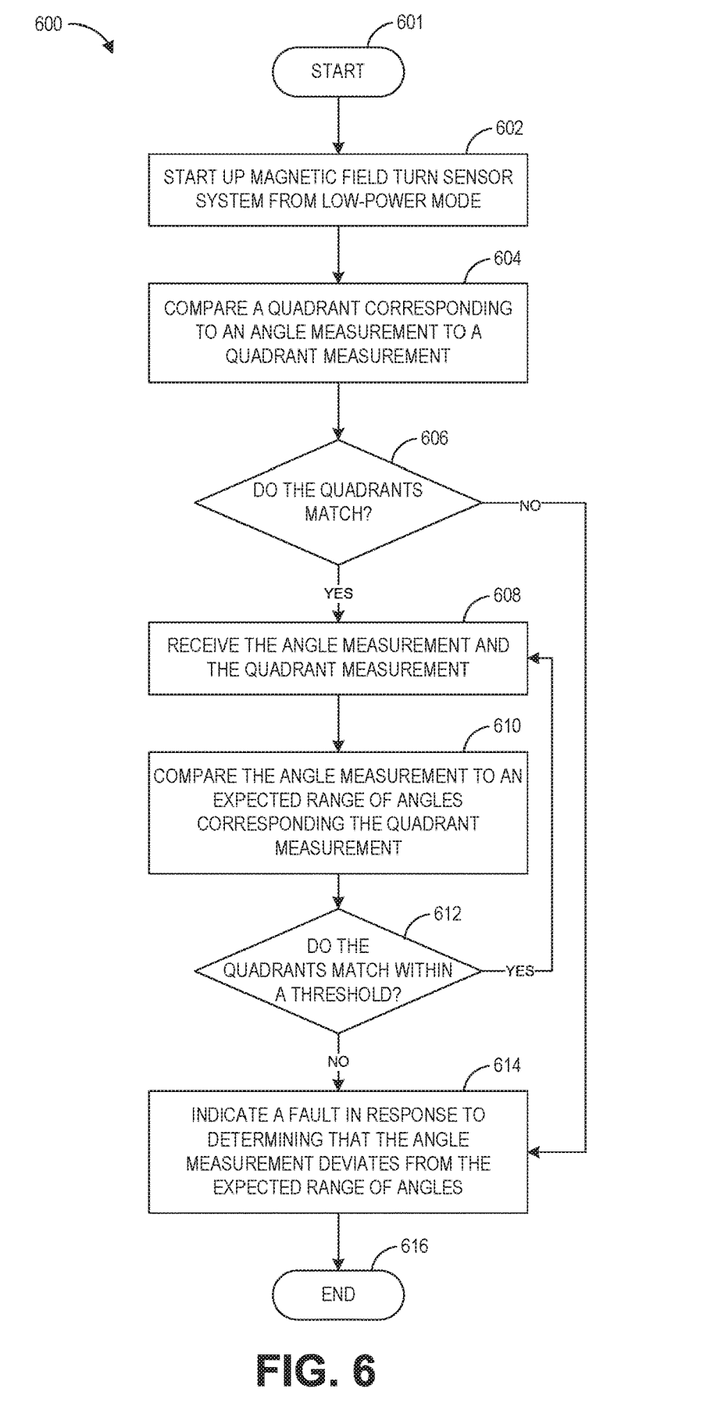
FIG. 6 is a flowchart of an example implementation of a method 600 for detecting errors in the comparator(s) 126 in accordance with aspects of this disclosure.

FIG. 6 is a flowchart of an example implementation of a method 600 for detecting errors in the comparator(s) 126 in accordance with aspects of this disclosure. The method 600 may be performed by the processor 117 of the magnetic field turn sensor system 102. However, in other embodiments, certain blocks of the method 600 may instead be performed by other components which may be located, for example, on the circuit board 108. While the method 600 is illustrated as a separate process from the method 500 shown in FIG. 5, in some implementations, methods 500 and 600 can be run in parallel to detect errors in the comparator(s) 126 or other parts of the magnetic field turn sensor system 102.

The method 600 begins at block 601. At block 602, the magnetic field turn sensor system 102 starts up from a low power mode. At block 604, the processor 117 compares a quadrant corresponding to an angle measurement from a signal processing path (e.g., from at least one of the first signal processing path 111 and the second signal processing path 113) to a quadrant measurement received from a turn count path 115. At block 606, if the quadrants from the comparison in block 604 match, the method 600 will continue at block 608. Otherwise, if the quadrants from the comparison in block 604 do not match, the method will continue at block 614.

For example, if the turn quadrant calculator 128 reports quadrant 3 (or octant 3a in the case that octants are output) and the angle calculators 116 and 124 report angles that are within quadrant 3 (or octant 3a), then the processor 117 will not generate a fault. In contrast, if the angle calculators 116 and 124 report angles that do not fall within quadrant 3 (or octant 3*a*), then the processor 117 will generate a fault, which may be interpreted as a fault within the quadrant calculator 128.

At block 608, the processor 117 received updated values of the angle measurement and the quadrant measurement. At block 610, the processor compares the angle measurement to an expected range of angles corresponding to the quadrant measurement. At block 612, if the angle measurement matches or is within a threshold of the expected range of angles, the method 600 will return to block 608. Otherwise, if the angle measurement different from the expected range of angles by more than a threshold (e.g., the angle measurement is greater than a threshold angle away from the expected range of angles), the method will continue at block 614.

At block 614, the processor 117 indicates a fault in response to determining that the angle measurement deviates from the expected range of angles corresponding to the quadrant measurement. The processor 117 can provide the indication of the fault to the motor control system, which can in turn take one or more actions to mitigate potential errors in the turn count sensor when the vehicle is turned on. Advantageously, by detecting whether the quadrant corresponding to the angle measurement matches the quadrant measurement, the method 600 can detect errors in which the quadrant measurement is "stuck" at a certain value. The method 600 ends at block 616.

Conclusion

Aspects of this disclosure can be implemented in various electronic devices. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "determining" encompasses a wide variety of actions. For example, "determining" may include calculating, computing, processing, deriving, investigating, looking up (e.g., looking up in a Table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules, and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. A magnetic field turn sensor system, comprising:
   a magnetic field angle sensor;
   a signal processing path configured to receive an output from the magnetic field angle sensor and generate an angle measurement based on the output;
   a turn count path configured to process the output from the magnetic field angle sensor and output a quadrant measurement based on the output;
   a memory configured to store an expected transition angle; and
   a processor configured to:
     receive the quadrant measurement from the turn count path,
     determine that the quadrant measurement is indicative of a transition between quadrants,
     retrieve, from the memory, the expected transition angle at which the quadrant measurement is indicative of the transition between quadrants,
     receive the angle measurement from the signal processing path,
     determine that the angle measurement deviates from the expected transition angle by more than a threshold value, and
     indicate a fault in response to determining that the angle measurement deviates from the expected transition angle by more than the threshold value.

2. The system of claim 1, wherein the magnetic field angle sensor comprises a first magnetic field angle sensor, the signal processing path comprises a first signal processing path, and the angle measurement comprises a first angle measurement, the system further comprising:
   a second magnetic field angle sensor; and
   a second signal processing path configured to receive an output from the second magnetic field angle sensor and generate a second angle measurement based on the output,
   wherein the processor is further configured to:
     receive the second angle measurement from the second signal processing path,
     determine that the first angle measurement differs from the second angle measurement by greater than a threshold angle, and
     indicate the fault in response to determining that the first angle measurement differs from the second angle measurement by greater than the threshold angle.

3. The system of claim 1, wherein the processor is further configured to:
   determine that the angle measurement does not deviate from the expected transition angle by more than the threshold value, and
   refrain from indicating the fault in response to determining that the angle measurement does not deviate from the expected transition angle by more than the threshold value.

4. The system of claim 1, wherein the processor is further configured to:
   store a plurality of historical values of the angle measurement in the memory, and
   determine the expected transition angle based on the historical values of the angle measurement.

5. The system of claim 4, wherein the processor is further configured to:
   for the transition between quadrants, average the historical values of the angle measurement corresponding to the transition between quadrants, and
   set the average of the historical values as the expected transition angle corresponding to the transition between quadrants.

6. The system of claim 1, wherein the processor is further configured to:
   in response to starting up from a low-power mode, compare a quadrant corresponding to the angle measurement to the quadrant measurement,
   determine that the quadrant corresponding to the angle measurement does not match the quadrant measurement, and
   indicate the fault in response to determining that the quadrant corresponding to the angle measurement does not match the quadrant measurement.

7. The system of claim 1, wherein the processor is further configured to:
   determine that the angle measurement deviates from an expected range of angles corresponding to the quadrant measurement by more than a threshold value, and
   indicate the fault in response to determining that the angle measurement deviates from the expected range of angles by more than the threshold value.

8. A motor control system configured to control a vehicle, comprising:
   a shaft connected to a steering wheel of the vehicle; and
   a memory configured to store an expected transition angle;
   a magnetic field turn sensor system comprising: a magnetic field angle sensor, a signal processing path configured to receive an output from the magnetic field angle sensor and generate an angle measurement based on the output, and a turn count path configured to process the output from the magnetic field angle sensor and output a quadrant measurement based on the output, and a processor configured to:
     receive the quadrant measurement from the turn count path,
     determine that the quadrant measurement is indicative of a transition between quadrants,
     retrieve, from the memory, the expected transition angle at which the quadrant measurement is indicative of the transition between quadrants,
     receive the angle measurement from the signal processing path,
     determine that the angle measurement deviates from the expected transition angle by more than a threshold value, and
     indicate a fault in response to determining that the angle measurement deviates from the expected transition angle by more than the threshold value.

9. The system of claim 8, wherein the magnetic field angle sensor comprises a first magnetic field angle sensor, the signal processing path comprises a first signal processing path, and the angle measurement comprises a first angle measurement, the system further comprising:
   a second magnetic field angle sensor; and
   a second signal processing path configured to receive an output from the second magnetic field angle sensor and generate a second angle measurement based on the output, wherein the processor is further configured to:
receive the second angle measurement from the second signal processing path,
determine that the first angle measurement differs from the second angle measurement by greater than a threshold angle, and
indicate the fault in response to determining that the first angle measurement differs from the second angle measurement by greater than the threshold angle.

10. The system of claim 8, wherein the processor is further configured to:
determine that the angle measurement does not deviate from the expected transition angle by more than the threshold value, and
refrain from indicating the fault in response to determining that the angle measurement does not deviate from the expected transition angle by more than the threshold value.

11. The system of claim 8, wherein the processor is further configured to:
store a plurality of historical values of the angle measurement in the memory, and
determine the expected transition angle based on the historical values of the angle measurement.

12. The system of claim 11, wherein the processor is further configured to:
for the transition between quadrants, average the historical values of the angle measurement corresponding to the transition between quadrants, and
set the average of the historical values as the expected transition angle corresponding to the transition between quadrants.

13. The system of claim 8, wherein the processor is further configured to:
in response to starting up from a low-power mode, compare a quadrant corresponding to the angle measurement to the quadrant measurement,
determine that the quadrant corresponding to the angle measurement does not match the quadrant measurement, and
indicate the fault in response to determining that the quadrant corresponding to the angle measurement does not match the quadrant measurement.

14. The system of claim 8, wherein the processor is further configured to:
determine that the angle measurement deviates from an expected range of angles corresponding to the quadrant measurement by more than a threshold value, and
indicate the fault in response to determining that the angle measurement deviates from the expected range of angles by more than the threshold value.

15. A method for detecting errors in a magnetic field turn sensor system, comprising:
receiving a quadrant measurement from a turn count path of the magnetic field turn sensor system, the magnetic field turn sensor system comprising a magnetic field angle sensor, a signal processing path configured to receive an output from the magnetic field angle sensor and generate the angle measurement based on the output, and the turn count path configured to process the output from the magnetic field angle sensor and output the quadrant measurement based on the output;
determining that the quadrant measurement is indicative of a transition between quadrants;
obtaining a predetermined expected transition angle at which the quadrant measurement is indicative of the transition between quadrants;
receiving the angle measurement from the signal processing path,
determining that the angle measurement deviates from the expected transition angle by more than a threshold value;
indicating a fault in response to determining that the angle measurement deviates from the expected transition angle by more than the threshold value;
in response to starting up from a low-power mode, comparing a quadrant corresponding to the angle measurement to the quadrant measurement;
determining that the quadrant corresponding to the angle measurement does not match the quadrant measurement; and
indicating the fault in response to determining that the quadrant corresponding to the angle measurement does not match the quadrant measurement.

16. The method of claim 15, wherein the magnetic field angle sensor comprises a first magnetic field angle sensor, the signal processing path comprises a first signal processing path, and the angle measurement comprises a first angle measurement, and the magnetic field turn sensor system further comprises: a second magnetic field angle sensor, and a second signal processing path configured to receive an output from the second magnetic field angle sensor and generate a second angle measurement based on the output, the method further comprising:
receiving the second angle measurement from the second signal processing path;
determining that the first angle measurement differs from the second angle measurement by greater than a threshold angle; and
indicating the fault in response to determining that the first angle measurement differs from the second angle measurement by greater than the threshold angle.

17. The method of claim 15, further comprising:
determining that the angle measurement does not deviate from the expected transition angle by more than the threshold value; and
refraining from indicating the fault in response to determining that the angle measurement does not deviate from the expected transition angle by more than the threshold value.

* * * * *